(12) United States Patent
Xue et al.

(10) Patent No.: US 11,699,627 B2
(45) Date of Patent: Jul. 11, 2023

(54) DMOS FET CHIP SCALE PACKAGE AND METHOD OF MAKING THE SAME

(71) Applicant: ALPHA AND OMEGA SEMICONDUCTOR INTERNATIONAL LP, Toronto (CA)

(72) Inventors: Yan Xun Xue, Los Gatos, CA (US); Long-Ching Wang, Cupertino, CA (US); Hongyong Xue, Portland, OR (US); Madhur Bobde, Sunnyvale, CA (US); Zhiqiang Niu, Santa Clara, CA (US); Jun Lu, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 75 days.

(21) Appl. No.: 17/187,682

(22) Filed: Feb. 26, 2021

(65) Prior Publication Data

US 2022/0278009 A1 Sep. 1, 2022

(51) Int. Cl.
*H01L 23/31* (2006.01)
*H01L 23/00* (2006.01)
*H01L 21/78* (2006.01)
*H01L 21/56* (2006.01)

(52) U.S. Cl.
CPC ........ *H01L 23/3114* (2013.01); *H01L 21/561* (2013.01); *H01L 21/78* (2013.01); *H01L 23/3135* (2013.01); *H01L 24/30* (2013.01); *H01L 24/83* (2013.01); *H01L 24/94* (2013.01); *H01L 2224/30181* (2013.01); *H01L 2224/83851* (2013.01)

(58) Field of Classification Search
CPC ... H01L 23/3114; H01L 21/561; H01L 21/78; H01L 23/3135; H01L 24/30; H01L 24/83; H01L 24/94; H01L 2224/30181; H01L 2224/83851
USPC ........................................................ 257/288
See application file for complete search history.

(56) References Cited

U.S. PATENT DOCUMENTS

| | | | | |
|---|---|---|---|---|
| 7,061,057 B2 * | 6/2006 | Babcock | ........... | H01L 29/66659 257/E29.054 |
| 7,898,026 B2 * | 3/2011 | Hsieh | ................ | H01L 29/66659 257/E29.256 |
| 8,319,284 B2 * | 11/2012 | Lin | .................... | H01L 29/41766 257/E27.06 |
| 8,610,103 B2 * | 12/2013 | Menon | .................... | H01S 5/423 257/E33.068 |
| 8,692,324 B2 * | 4/2014 | Korec | ................. | H01L 29/7816 257/493 |
| 9,105,691 B2 * | 8/2015 | Cheng | ..................... | H01L 21/84 |
| 9,455,187 B1 * | 9/2016 | Gambino | .............. | H01L 23/528 |
| 9,530,796 B2 * | 12/2016 | Stuber | ................. | H01L 27/1203 |
| 10,083,897 B2 * | 9/2018 | Tu | ..................... | H01L 29/78639 |

(Continued)

*Primary Examiner* — Vu A Vu
(74) *Attorney, Agent, or Firm* — Chen-Chi Lin

(57) ABSTRACT

A method comprises the steps of providing a wafer; applying a redistribution layer, grinding a back side of the wafer; depositing a metal layer; and applying a singulation process. A semiconductor package comprises a metal-oxide-semiconductor field-effect transistor (MOSFET), a redistribution layer, and a metal layer. The MOSFET comprises a source electrode, a gate electrode, a drain electrode and a plurality of partial drain plugs. The source electrode, the gate electrode, and the drain electrode are positioned at a front side of the MOSFET.

17 Claims, 8 Drawing Sheets

(56) References Cited

U.S. PATENT DOCUMENTS 10,446,442 B2 * 10/2019 Butt .................. H01L 21/76895
10,468,405 B2 * 11/2019 Sander ............ H01L 21/823475

* cited by examiner

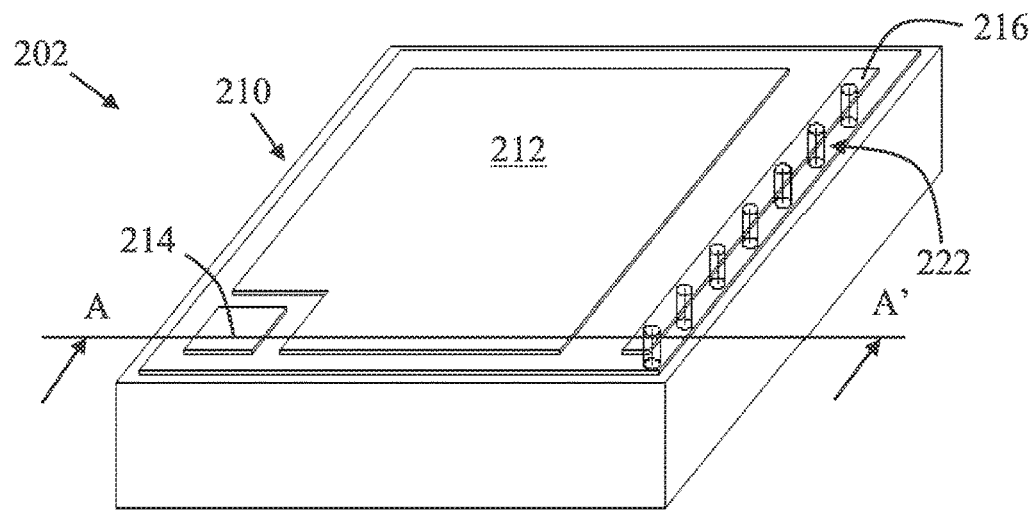
FIG. 2Ai
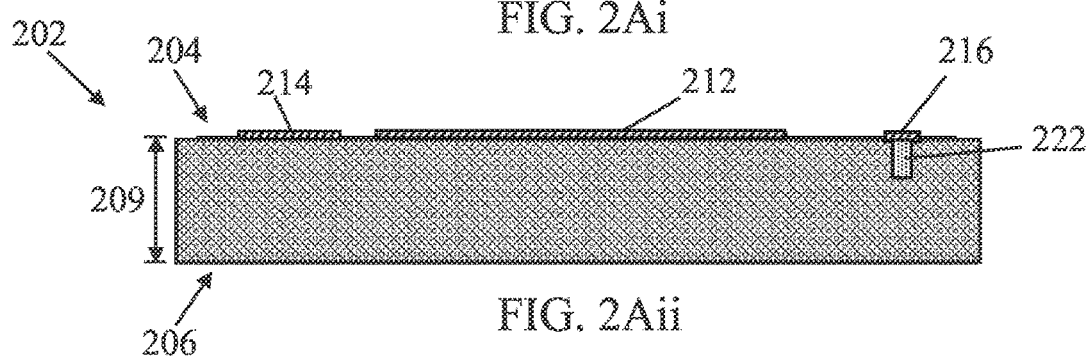
FIG. 2Aii
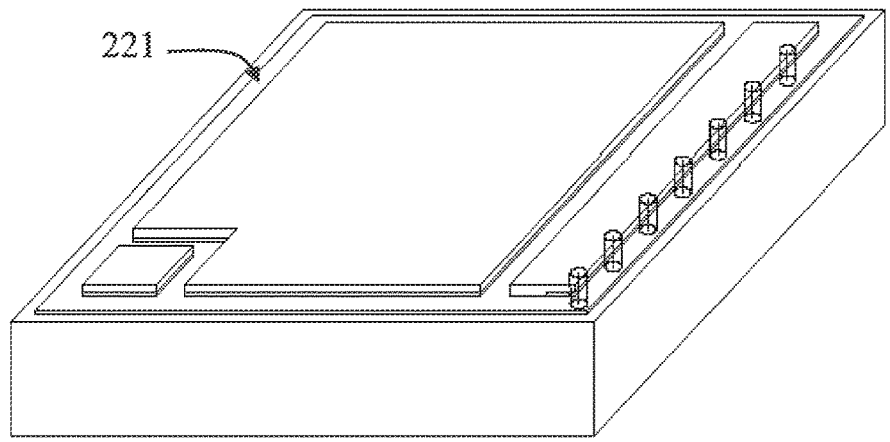
FIG. 2Bi
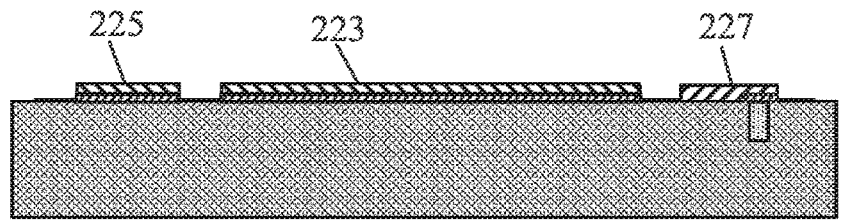
FIG. 2Bii

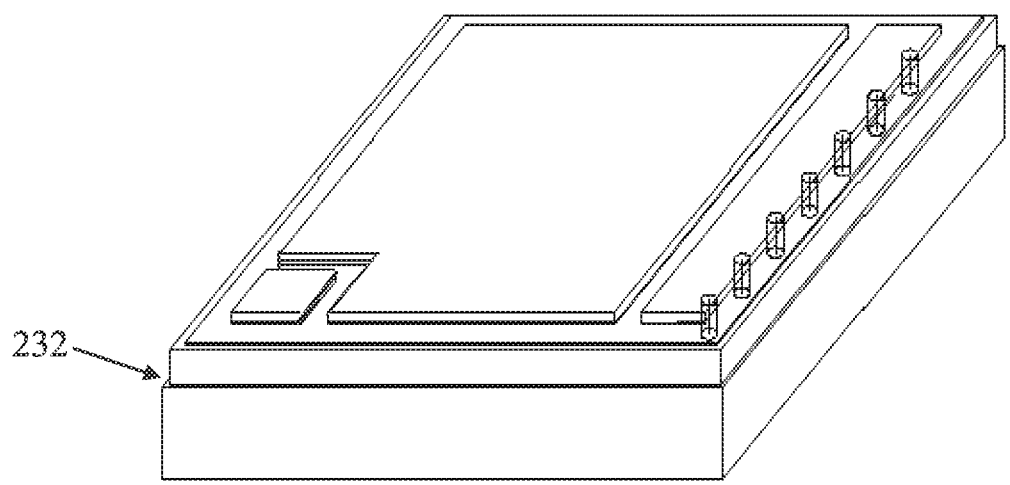
FIG. 2Ci
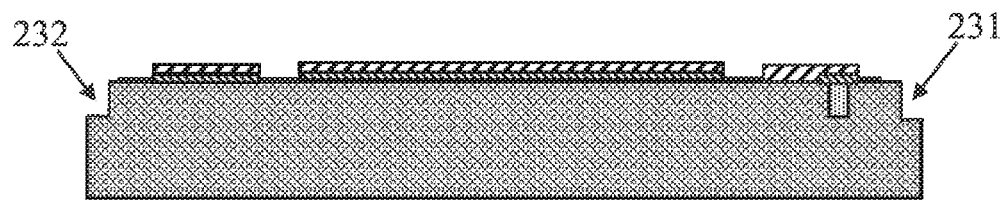
FIG. 2Cii
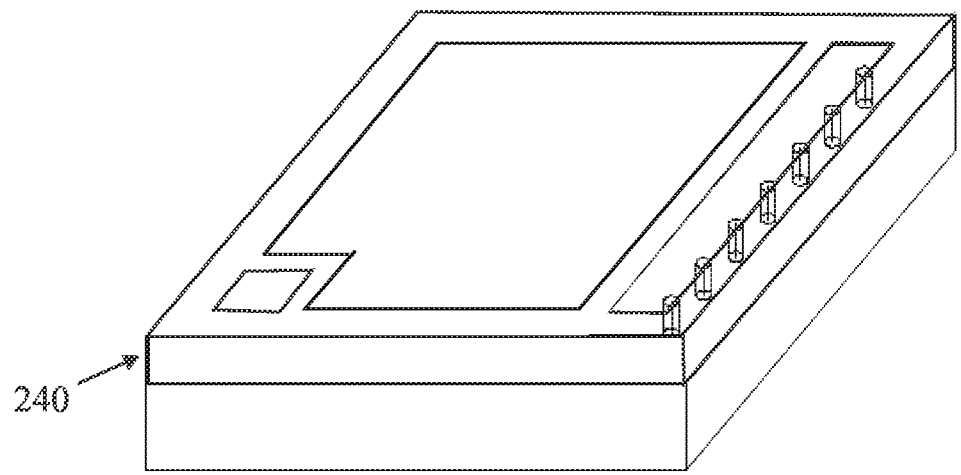
FIG. 2Di
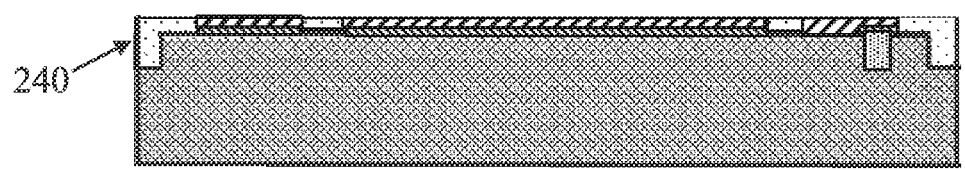
FIG. 2Dii

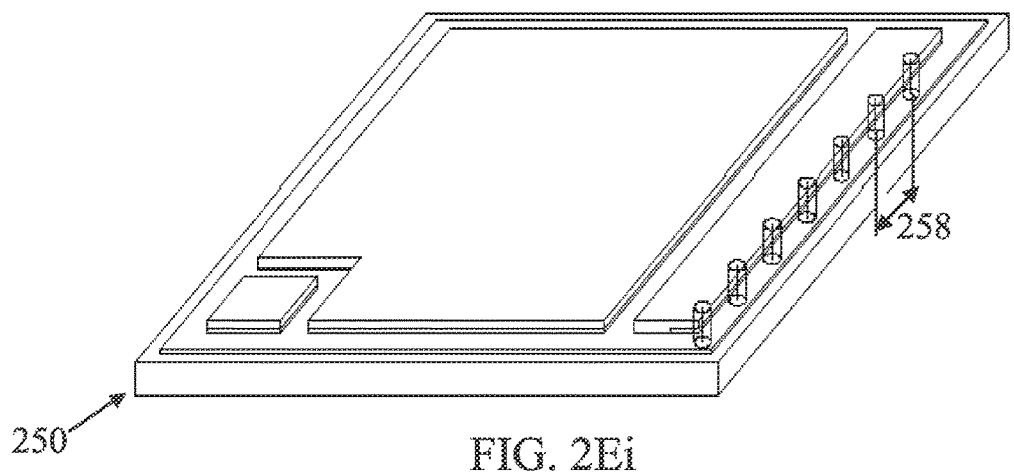
FIG. 2Ei
FIG. 2Eii
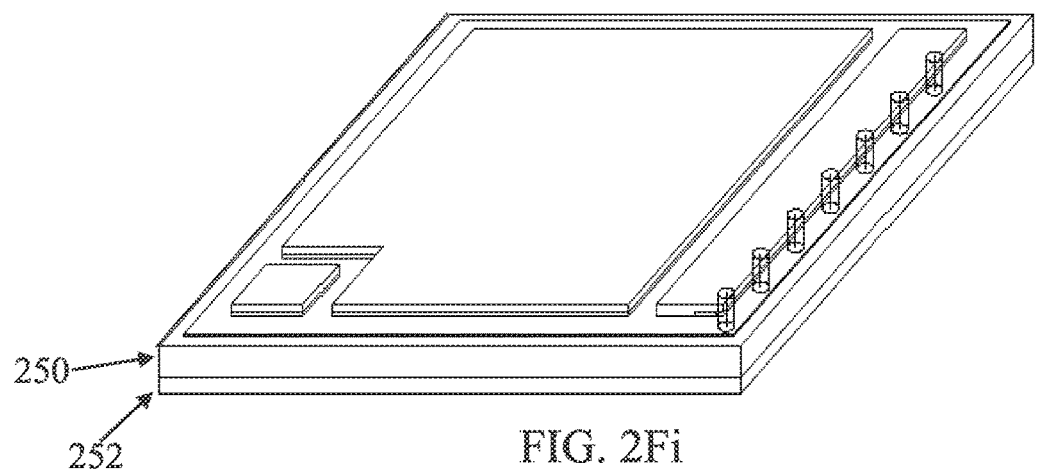
FIG. 2Fi
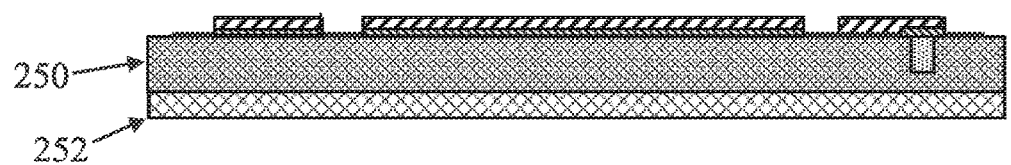
FIG. 2Fii

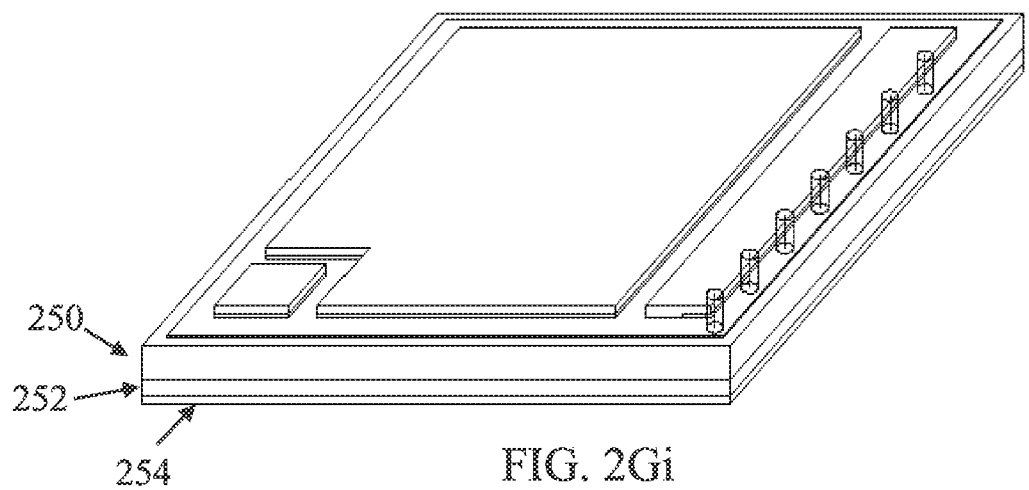
FIG. 2Gi
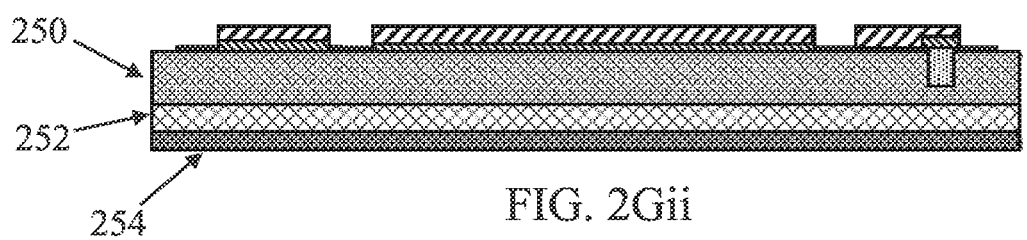
FIG. 2Gii
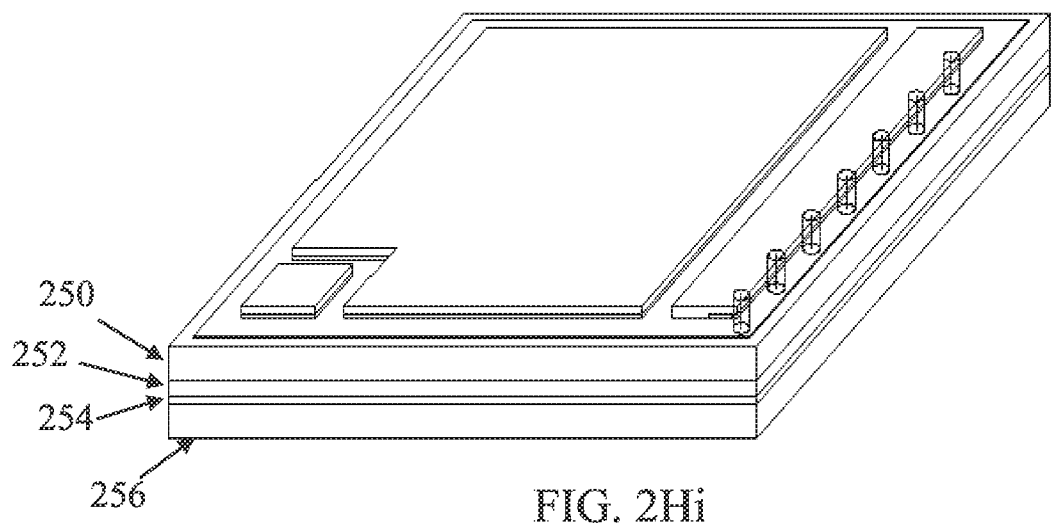
FIG. 2Hi
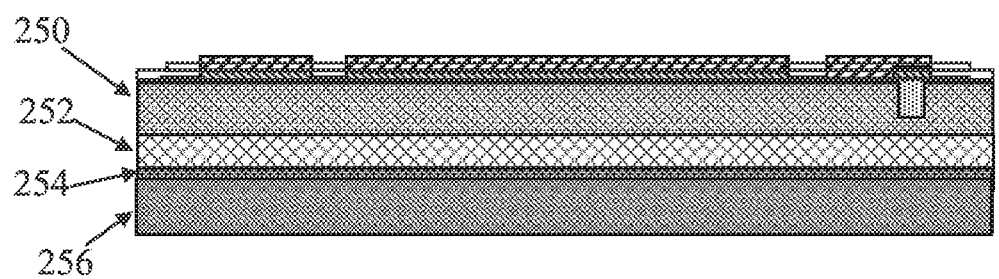
FIG. 2Hii

FIG. 2Iii

DMOS FET CHIP SCALE PACKAGE AND METHOD OF MAKING THE SAME

FIELD OF THE INVENTION

This invention relates generally to a semiconductor package comprising a transistor and method of making the same. More particularly, the present invention relates to a semiconductor package comprising a double-diffused metal-oxide-semiconductor field-effect transistor (DMOS FET) with a source electrode, a gate electrode, and a drain electrode are all positioned on a front side.

BACKGROUND OF THE INVENTION

Traditional DMOS FET is formed with a vertical structure. The source electrode and the gate electrode are on the front side and the drain electrode is on the back side. Packaging of a DMOS FET requires connection using wires and clips, thus increasing the package size.

It is advantageous to move the drain electrode from the back side to the front side so that the source electrode, the gate electrode, and the drain electrode are all positioned on the front side. It facilitates surface mount technology on printed circuit board with low electrical resistance and with reduced package size. The semiconductor packages are fabricated by a wafer level chip scale package (WLCSP) method.

SUMMARY OF THE INVENTION

A method comprises the steps of providing a wafer; applying a redistribution layer, grinding a back side of the wafer; depositing a metal layer; and applying a singulation process.

A semiconductor package comprises a metal-oxide-semiconductor field-effect transistor (MOSFET), a redistribution layer, and a metal layer. The MOSFET comprises a source electrode, a gate electrode, a drain electrode and a plurality of partial drain plugs. The source electrode, the gate electrode, and the drain electrode are positioned at a front side of the MOSFET.

DETAILED DESCRIPTION OF THE INVENTION

Figure 1:
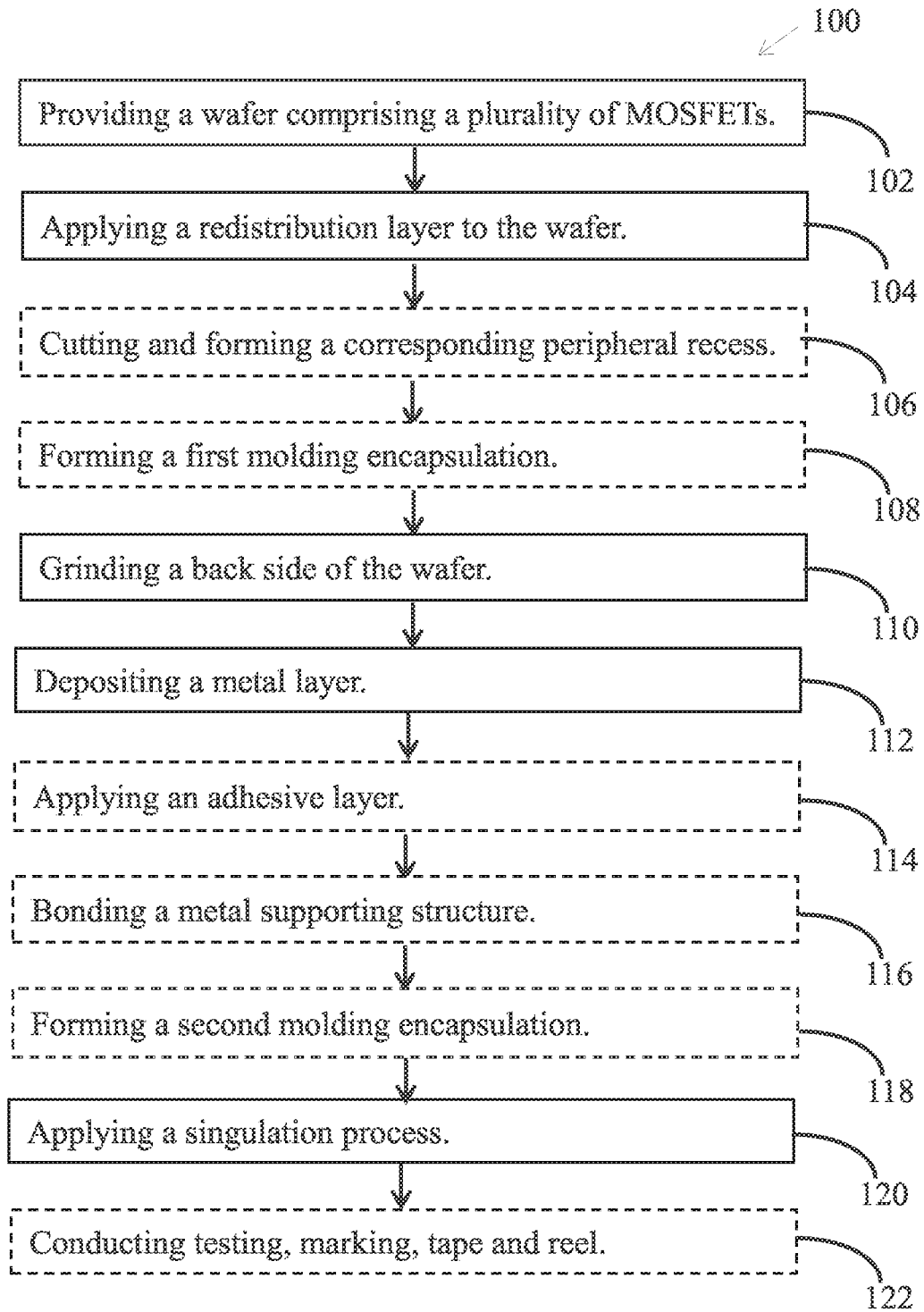
FIG. 1 is a flowchart of a process to develop a plurality of semiconductor packages in examples of the present disclosure.

FIG. 1 is a flowchart of a process 100 to develop a plurality of semiconductor packages in examples of the present disclosure. FIGS. 2Ai, 2Bi, 2Ci, 2Di, 2Ei, 2Fi, 2Gi, 2Hi, and 2Ii, show the perspective views and FIGS. 2Aii, 2Bii, 2Cii, 2Dii, 2Eii, 2Fii, 2Gii, 2Hii, 2Iii, 2J, and 2K show the cross sections of the corresponding steps. A number of semiconductor packages made from one wafer may vary. For simplification, only one semiconductor package is shown in FIGS. 2Ai, 2Bi, 2Ci, 2Di, 2Ei, 2Fi, 2Gi, 2Hi, and 2Ii, and FIGS. 2Aii, 2Bii, 2Cii, 2Dii, 2Eii, 2Fii, 2Gii, 2Hii, 2Iii, and 2K. For simplification, only two semiconductor packages are shown in FIG. 2J. The process 100 may start from block 102.

In block 102, referring now to FIGS. 2Ai and 2Aii, a wafer 202 is provided. FIG. 2Aii is a cross-sectional plot along AA' of FIG. 2Ai. The wafer 202 comprises a front side 204 and a back side 206 opposite the front side 204. In one example, the wafer 202 is a silicon wafer. The wafer 202 may be a 4-inch, 6-inch, 8-inch, 12-inch, or 18-inch diameter wafer. In one example, a thickness 209 of the wafer 202 is 760 microns. In another example, the thickness 209 of the wafer 202 is in a range from 700 microns to 800 microns.

The wafer 202 includes a plurality of metal-oxide-semiconductor field-effect transistors (MOSFETs). Each MOSFET 210 of the plurality of MOSFETs comprises a source electrode 212, a gate electrode 214, a drain electrode 216, and a plurality of partial drain plugs 222. The source electrode 212, the gate electrode 214, and the drain electrode 216 are positioned at the front side 204 of the wafer 202. The plurality of partial drain plugs 222 connect to the drain electrode 216 on the front side 204 of the wafer 202 and extend into a depth of the wafer 202. In examples of the present disclosure, the plurality of partial drain plugs 222 are filled with conductive materials. Block 102 may be followed by block 104.

In block 104, referring now to FIGS. 2Bi and 2Bii, a redistribution layer 221 is applied to the front side 204 of the wafer 202. The redistribution layer 221 is made of a conductive material. In one example, the redistribution layer 221 comprises a source section 223, a gate section 225, and a drain section 227. The source section 223 is directly on top of the source electrode 212. The gate section 225 is directly on top of the gate electrode 214. The drain section 227 is directly attached to the drain electrode 216. A top surface of the drain section 227 is larger than a top surface of the drain electrode 216. In one example, the top surface of the drain section 227 is 2 times to 5 times of the top surface of the drain electrode 216. Block 104 may be followed by optional block 106, optional block 108, or block 110.

In optional block 106 (shown in dashed lines), referring now to FIGS. 2Ci and 2Cii, a peripheral recess 232 was cut and formed on a top portion 231 of each MOSFET 210. In one example, each MOSFET 210 is of a rectangular prism shape. The peripheral recess 232 is along the four sides of a top surface of the rectangular prism shape. In one example, the peripheral recess 232 extends into the wafer 202 to a depth deeper than a bottom of the plurality of partial drain plugs 222. Block 106 may be followed by optional block 108 or block 110.

In optional block 108 (shown in dashed lines), referring now to FIGS. 2Di and 2Dii, a first molding encapsulation 240 is formed. The first molding encapsulation 240 fills gaps between the source section 223, the gate section 225, and the drain section 227 of each MOSFET 210. A top surface of the first molding encapsulation 240 is substantially coplanar to a top surface of the redistribution layer 221. In one example, the first molding encapsulation 240 also fills the peripheral recess 232 of each MOSFET 210. Block 108 may be followed by block 110.

In block 110, referring now to FIGS. 2Ei and 2Eii, the back side 206 of the wafer 202 is grinded so as forming a thinned wafer 250. In one example, the back side 206 of the wafer 202 is grinded to maintain a space between the bottom of the plurality of partial drain plugs 222 to a back side of the thinned wafer 250 not more than 25% of a thickness of the thinned wafer 250. In one example, the back side 206 of the wafer 202 is grinded to exposed a bottom of the optional peripheral recess 232. In one example, the back side 206 of the wafer 202 is grinded to a depth between the bottom of the optional peripheral recess 232 and the bottom of the plurality of partial drain plugs 222. In one example, a depth 253 of each of the plurality of partial drain plugs 222 is 20 microns. In another example, the depth 253 of each of the plurality of partial drain plugs 222 is in a range from 19 microns to 21 microns. In one example, a thickness 255 of the thinned wafer is 25 microns. In another example, the thickness 255 of the thinned wafer is in a range from 24 microns to 26 microns. From the resistance calculation equation, $R=\rho L/S$, the resistance of remaining of Si between a partial drain plug and the bottom side of the wafer can be calculated. Here, R represents resistance; $\rho$ represents resistivity of Si; L represents the remaining thickness of Si and S represents cross-sectional area of the partial drain plug. The plurality of partial drain plugs 222 are in parallel, therefore the total resistance is R/N. Here, N represents a total number of partial drain plugs. This total resistance of the present disclosure is small compared with the case of a wafer without partial drain plugs.

In one example, a diameter 257 of each of the plurality of partial drain plugs 222 is 1.4 micron. In another example, the diameter 257 of each of the plurality of partial drain plugs 222 is in a range from 1 micron to 2 microns. In one example, a pitch 258 between a selected partial drain plug of the plurality of partial drain plugs and a corresponding adjacent partial drain plug is 3 microns. In another example, the pitch 258 between a selected partial drain plug of the plurality of partial drain plugs and a corresponding adjacent partial drain plug is in a range from 2 microns to 4 microns. Block 110 may be followed by block 112.

In block 112, referring now to FIGS. 2Fi and 2Fii, a metal layer 252 is deposited on a back side of the thinned wafer 250. Block 112 may be followed by optional block 114, optional block 116, optional block 118, or block, 120.

In optional block 114, referring now to FIGS. 2Gi and 2Gii, a conductive adhesive layer 254 is applied to a back side of the metal layer 252. Block 114 may be followed by block 116.

In optional block 116, referring now to FIGS. 2Hi and 2Hii, a metal supporting structure 256 is bonded to the conductive adhesive layer 254. In one example, the metal supporting structure 256 comprises a film laminate and a metal layer. In another example, the metal supporting structure 256 comprises a film laminate, a metal layer, and a marking film coating. In one example, the film laminate is a sintering Ag film. In another example, the film laminate is a conductive die attach film (CDAF). Block 116 may be followed by block 118.

Figure 2I:
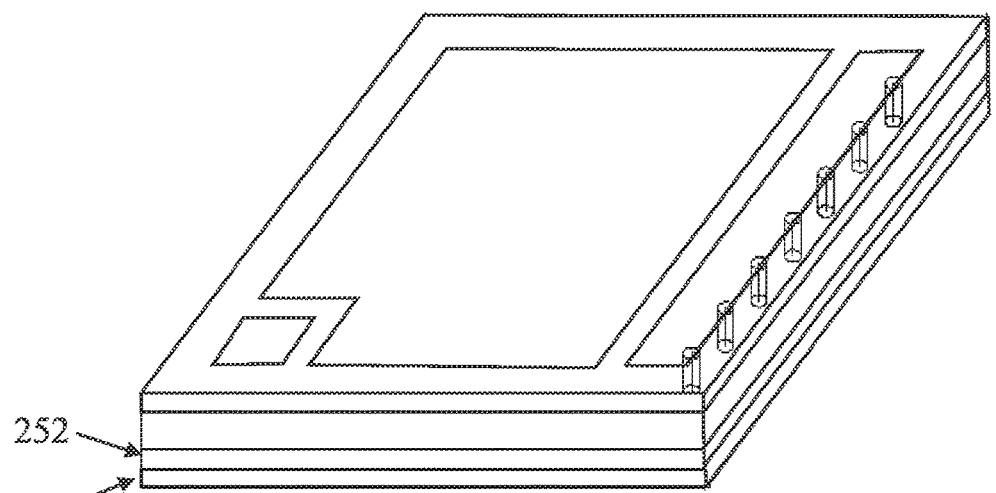
FIGS. 2Ai, 2Bi, 2Ci, 2Di, 2Ei, 2Fi, 2Gi, 2Hi, and 2Ii, show the perspective views and FIGS. 2Aii, 2Bii, 2Cii, 2Dii, 2Eii, 2Fii, 2Gii, 2Hii, 2Iii, 2J, and 2K show the cross sections of the corresponding steps of the process of FIG. 1 in examples of the present disclosure.
Figure 2J:
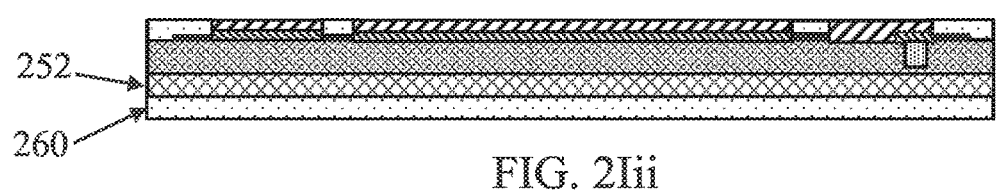
Figure 2J:
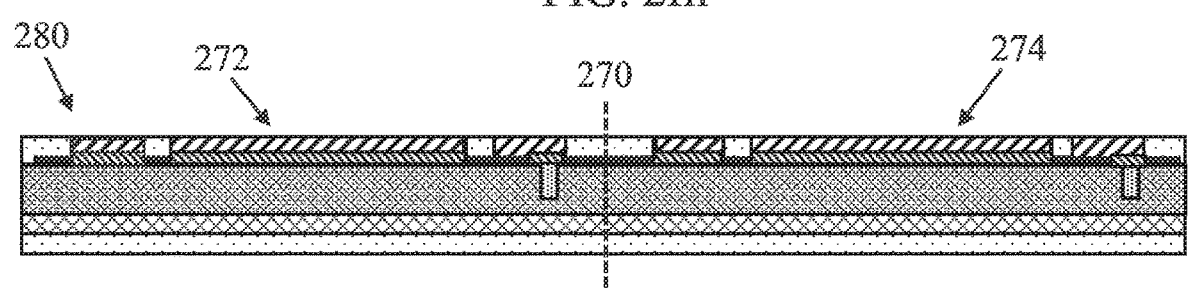
Figure 2K:
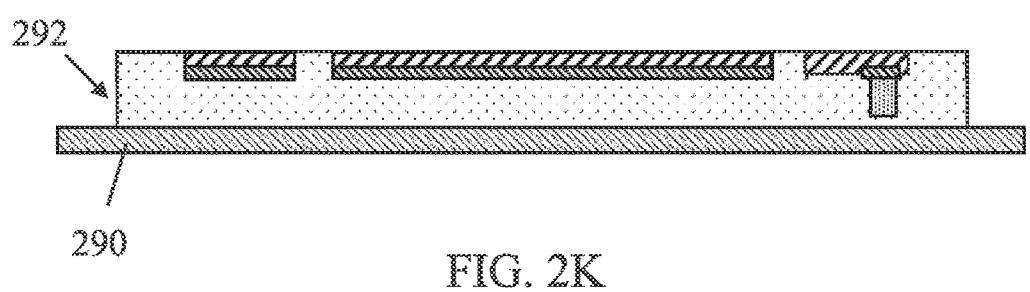

In optional block 118, referring now to FIGS. 2Ii and 2Iii, a second molding encapsulation 260 is formed. In one example, optional block 114 and optional block 116 are not executed. The second molding encapsulation 260 is directly attached to the metal layer 252. In another example, optional block 114 and optional block 116 are not executed. The second molding encapsulation 260 encloses a majority portion of a respective metal section of a plurality of metal sections of the metal layer 252. The respective metal section being attached to back surface of each MOSFET 210. Block 118 may be followed by block 120.

In block 120, referring now to FIG. 2J, a singulation process 270 is applied so as forming the plurality of semiconductor packages 280. Though only two semiconductor packages 272 and 274 are shown in FIG. 2J, the number of the plurality of semiconductor packages 280 fabricated from one wafer may vary. Block 120 may be followed by optional block 122.

In optional block 122, referring now to FIG. 2J, testing, marking, tape and reel are applied. In one example, a tape 290 is attached to a semiconductor package 292.

Figure 3:
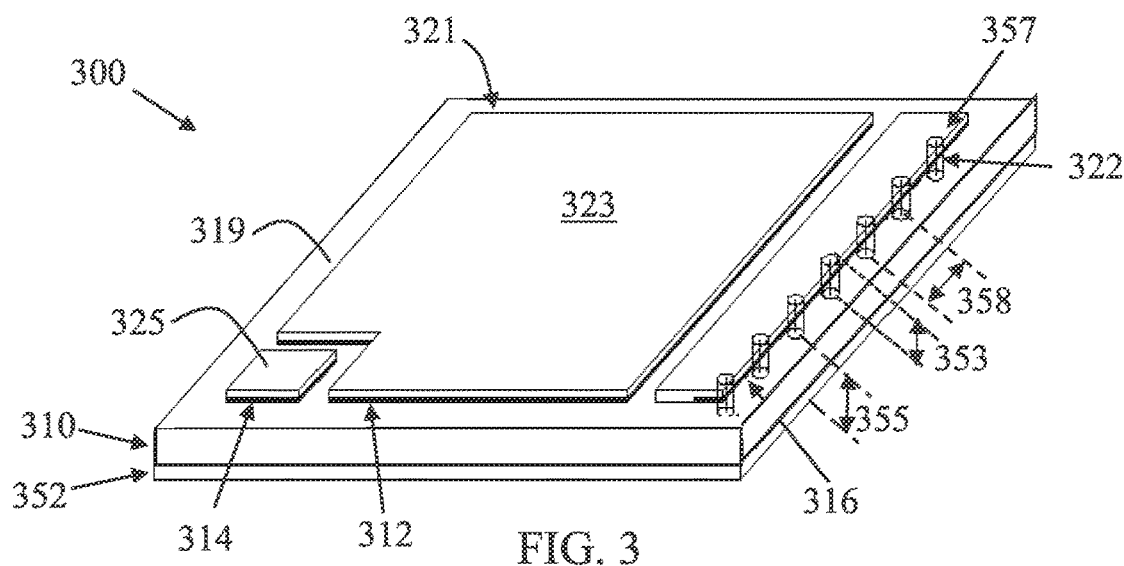
FIG. 3 shows a perspective view of a semiconductor package in examples of the present disclosure.

FIG. 3 shows a perspective view of a semiconductor package 300 in examples of the present disclosure. In one example, the semiconductor package 300 is fabricated using the steps including block 102, block 104, block 110, block 112, and block 120. The semiconductor package 300 comprises a metal-oxide-semiconductor field-effect transistor (MOSFET) 310, a redistribution layer 321, and a metal layer 352. The MOSFET 310 comprises a source electrode 312, a gate electrode 314, a drain electrode 316 and a plurality of partial drain plugs 322. The source electrode 312, the gate electrode 314, and the drain electrode 316 are positioned at a front side of the MOSFET 310. In examples of the present disclosure, no electrodes are positioned at a back side of the MOSFET 310. In one example, a layer of polyimide 319 is attached to the front side of the MOSFET 310. The layer of polyimide 319 is between the source electrode 312 and the gate electrode 314. The layer of polyimide 319 is between the source electrode 312 and the drain electrode 316. The plurality of partial drain plugs 322 are connected to the drain electrode 316. The redistribution layer 321 is made of a conductive material. In one example, the redistribution layer 321 comprises a source section 323, a gate section 325, and a drain section 327. The source section 323 is directly on top of the source electrode 312. The gate section 325 is directly on top of the gate electrode 314. The drain section 327 is directly attached to the drain electrode 316.

In one example, a depth 353 of each of the plurality of partial drain plugs 322 is 20 microns. In another example, the depth 353 of each of the plurality of partial drain plugs 322 is in a range from 19 microns to 21 microns. In one example, a thickness 355 of the MOSFET 310 is 25 microns. In another example, the thickness 355 of the MOSFET 310 is in a range from 24 microns to 26 microns.

In one example, a diameter 357 of each of the plurality of partial drain plugs 322 is 1.4 micron. In another example, the diameter 357 of each of the plurality of partial drain plugs 322 is in a range from 1 micron to 2 microns. In one example, a pitch 358 between a selected partial drain plug of the plurality of partial drain plugs 322 and a corresponding adjacent partial drain plug is 3 microns. In another example, the pitch 358 between a selected partial drain plug of the plurality of partial drain plugs 322 and a corresponding adjacent partial drain plug is in a range from 2 microns to 4 microns.

Figure 4:
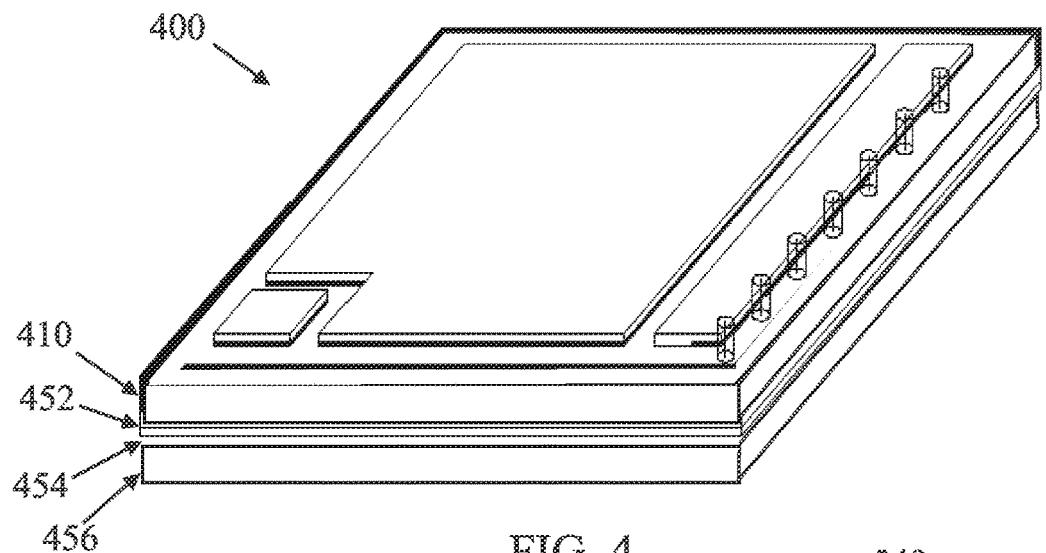
FIG. 4 shows a perspective view of another semiconductor package in examples of the present disclosure.

FIG. 4 shows a perspective view of a semiconductor package 400 in examples of the present disclosure. In one example, the semiconductor package 400 is fabricated using the steps including block 102, block 104, block 110, block 112, block 114, block 116, and block 120. The semiconductor package 400 comprises a metal-oxide-semiconductor field-effect transistor (MOSFET) 410, a redistribution layer 421, a metal layer 452, an adhesive layer 454, and a metal supporting structure 456.

Figure 5:
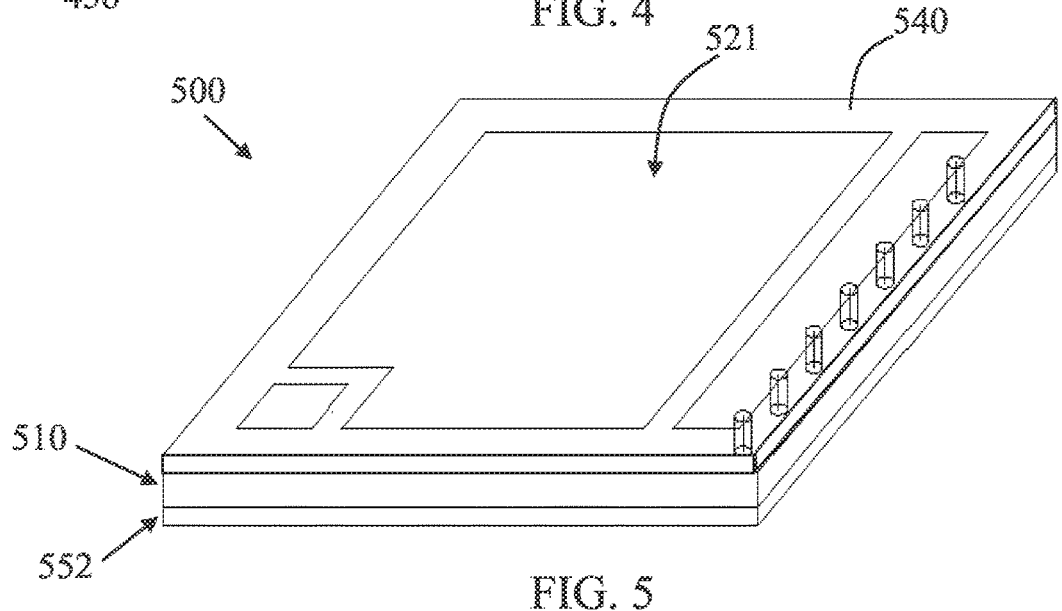
FIG. 5 shows a perspective view of still another semiconductor package in examples of the present disclosure.

FIG. 5 shows a perspective view of a semiconductor package 500 in examples of the present disclosure. In one example, the semiconductor package 500 is fabricated using the steps including block 102, block 104, block 108, block 110, block 112, and block 120. The semiconductor package 500 comprises a metal-oxide-semiconductor field-effect transistor (MOSFET) 510, a redistribution layer 521, a metal layer 552, and a molding encapsulation 540. In examples of the present disclosure, the molding encapsulation 540 encloses a majority portion of the source electrode of the MOSFET 510, a majority portion of the gate electrode of the MOSFET 510, and a majority portion of the drain electrode of the MOSFET 510.

Figure 6:
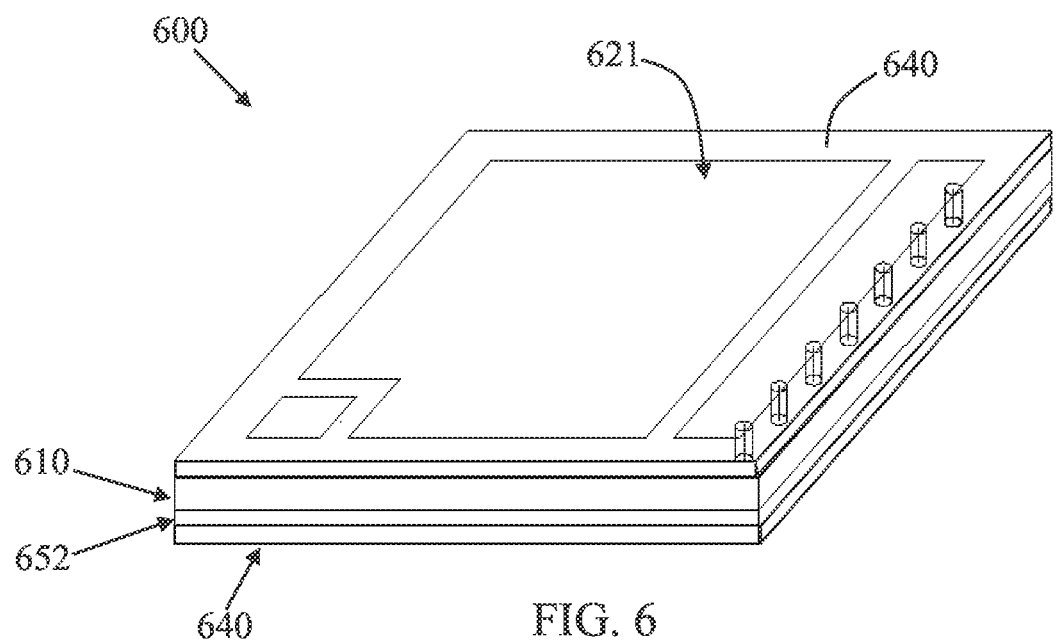
FIG. 6 shows a perspective view of yet another semiconductor package in examples of the present disclosure.

FIG. 6 shows a perspective view of a semiconductor package 600 in examples of the present disclosure. In one example, the semiconductor package 600 is fabricated using the steps including block 102, block 104, block 108, block 110, block 112, block 118, and block 120. The semiconductor package 600 comprises a metal-oxide-semiconductor field-effect transistor (MOSFET) 610, a redistribution layer 621, a metal layer 652, a first molding encapsulation 640, and a second molding encapsulation 660. In one example, the first molding encapsulation 640 does not directly contact the second molding encapsulation 660. In examples of the present disclosure, the first molding encapsulation 640 encloses a majority portion of the source electrode of the MOSFET 610, a majority portion of the gate electrode of the MOSFET 610, and a majority portion of the drain electrode of the MOSFET 610. In examples of the present disclosure, the second molding encapsulation 660 is directly attached to the metal layer 652.

Figure 7:
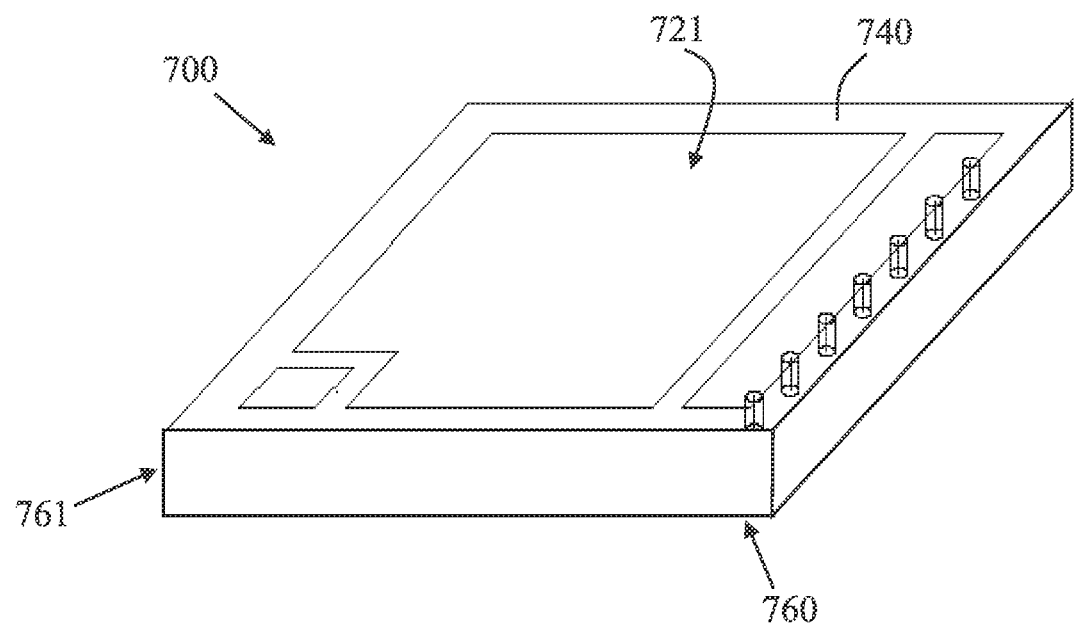
FIG. 7 shows a perspective view of still yet another semiconductor package in examples of the present disclosure.

FIG. 7 shows a perspective view of a semiconductor package 700 in examples of the present disclosure. In one example, the semiconductor package 700 is fabricated using the steps including block 102, block 104, block 106, block 108, block 110, block 112, block 118, and block 120. The semiconductor package 700 comprises a metal-oxide-semiconductor field-effect transistor (MOSFET) 710, a redistribution layer 721, a metal layer 752, a first molding encapsulation 740, and a second molding encapsulation 760. In one example, the first molding encapsulation 740 and the second molding encapsulation 760 share a common interface surface 761. In examples of the present disclosure, the first molding encapsulation 740 covers a majority portion of the peripheral recess 232 of FIGS. 2Gi and 2Gii. The first molding encapsulation 740 encloses a majority portion of the source electrode of the MOSFET 710, a majority portion of the gate electrode of the MOSFET 710, and a majority portion of the drain electrode of the MOSFET 710. In examples of the present disclosure, the second molding encapsulation 760 encloses the metal layer 752.

Those of ordinary skill in the art may recognize that modifications of the embodiments disclosed herein are possible. For example, a number of the plurality of semiconductor packages made from one wafer may vary. A number of the plurality of partial drain plugs may vary. Other modifications may occur to those of ordinary skill in this art, and all such modifications are deemed to fall within the purview of the present invention, as defined by the claims.

The invention claimed is:

1. A method for fabricating a plurality of semiconductor packages,
the method comprising the steps of:
providing a wafer comprising a front side and a back side opposite the front side, the wafer including a plurality of metal-oxide-semiconductor field-effect transistors (MOSFETs), each MOSFET of the plurality of MOSFETs comprising
a source electrode, a gate electrode, and a drain electrode positioned at the front side of the wafer; and
a plurality of partial drain plugs extending a first depth from the front side into the wafer, the plurality of partial drain plugs connected to the drain electrode;
forming a redistribution layer on the front side of the wafer;
forming a peripheral recess on a top portion of each MOSFET;
forming a first molding encapsulation filling the peripheral recess of each MOSFET, and enclosing sidewalls of the redistribution layer;
grinding the back side of the wafer forming a thinned wafer;
depositing a metal layer on a back side of the thinned wafer; and
applying a singulation process so as forming the plurality of semiconductor packages;
wherein the step of grinding the back side of the wafer forming the thinned wafer further grinds the back side of the wafer to maintain a space between a bottom of the plurality of partial drain plugs to the back side of the thinned wafer not more than 25% of a thickness of the thinned wafer.

2. The method of claim 1, after the step of depositing the metal layer, further comprising
forming a second molding encapsulation enclosing a majority portion of a respective metal section of a plurality of metal sections of the metal layer, the respective metal section being attached to each MOSFET.

3. The method of claim 1, wherein the peripheral recess extends a second depth into the wafer deeper than the first depth.

4. The method of claim 3, wherein the step of grinding the back side of the wafer forming the thinned wafer further exposes a bottom of the peripheral recess.

5. The method of claim 4, wherein the step of grinding the back side of the wafer forming the thinned wafer further grinds the back side of the wafer to a depth between the first depth and the second depth.

6. The method of claim 4, after the step of depositing the metal layer, further comprising
forming a second molding encapsulation enclosing a majority portion of a respective metal section of a plurality of metal sections of the metal layer, the respective metal section being attached to each MOSFET.

7. The method of claim 1, wherein the first depth of each of the plurality of partial drain plugs is in a range from nineteen microns to twenty-one microns; and wherein a thickness of the thinned wafer is in a range from twenty-four microns to twenty-six microns.

8. The method of claim 1, wherein a diameter of each of the plurality of partial drain plugs is in a range from one micron to two microns; and a pitch between a selected partial drain plug of the plurality of partial drain plugs and a corresponding adjacent partial drain plug is in a range from two microns to four microns.

9. A semiconductor package comprising:
a metal-oxide-semiconductor field-effect transistor (MOSFET) comprising
a source electrode, a gate electrode, and a drain electrode positioned at a front side of the MOSFET; and
a plurality of partial drain plugs extending a first depth from the front side into the MOSFET, the plurality of partial drain plugs connected to the drain electrode;

a redistribution layer attached to the front side of the MOSFET;
a metal layer attached to a back side of the MOSFET;
a conductive adhesive layer attached to a back side of the metal layer; and
a metal supporting structure attached to a back side of the conductive adhesive layer,
wherein a space between a bottom of the plurality of partial drain plugs to the metal layer is not more than 25% of a thickness of the MOSFET.

10. The semiconductor package of claim 9 further comprising
a peripheral recess on a top portion of the MOSFET; and
a first molding encapsulation filling the peripheral recess, and enclosing sidewalls of the redistribution layer.

11. The semiconductor package of claim 10 further comprising
a second molding encapsulation enclosing a majority portion of the metal layer.

12. A semiconductor package comprising:
a metal-oxide-semiconductor field-effect transistor (MOSFET) comprising
a source electrode, a gate electrode, and a drain electrode positioned at a front side of the MOSFET; and
a plurality of partial drain plugs extending a first depth from the front side into the MOSFET, the plurality of partial drain plugs connected to the drain electrode;
a redistribution layer attached to the front side of the MOSFET;
a first molding encapsulation enclosing sidewalls of the redistribution layer; and
a metal layer attached to a back side of the MOSFET, wherein a space between a bottom of the plurality of partial drain plugs to the metal layer is not more than 25% of a thickness of the MOSFET.

13. The semiconductor package of claim 12 further comprising
a second molding encapsulation enclosing a majority portion of the metal layer.

14. A semiconductor package comprising:
a metal-oxide-semiconductor field-effect transistor (MOSFET) comprising
a source electrode, a gate electrode, and a drain electrode positioned at a front side of the MOSFET; and
a plurality of partial drain plugs extending a first depth from the front side into the MOSFET, the plurality of partial drain plugs connected to the drain electrode;
a redistribution layer attached to the front side of the MOSFET; and
a metal layer attached to a back side of the MOSFET;
wherein a space between a bottom of the plurality of partial drain plugs to the metal layer is not more than 25% of a thickness of the MOSFET; and
wherein a depth of each of the plurality of partial drain plugs is in a range from nineteen microns to twenty-one microns; and wherein a thickness of the MOSFET is in a range from twenty-four microns to twenty-six microns.

15. A semiconductor package comprising:
a metal-oxide-semiconductor field-effect transistor (MOSFET) comprising
a source electrode, a gate electrode, and a drain electrode positioned at a front side of the MOSFET; and
a plurality of partial drain plugs extending a first depth from the front side into the MOSFET, the plurality of partial drain plugs connected to the drain electrode;
a redistribution layer attached to the front side of the MOSFET; and
a metal layer attached to a back side of the MOSFET;
wherein a space between a bottom of the plurality of partial drain plugs to the metal layer is not more than 25% of a thickness of the MOSFET; and
wherein a diameter of each of the plurality of partial drain plugs is in a range from one micron to twenty microns; and a pitch between a selected partial drain plug of the plurality of partial drain plugs and a corresponding adjacent partial drain plug is in a range from two microns to four microns.

16. A method for fabricating a plurality of semiconductor packages, the method comprising the steps of:
providing a wafer comprising a front side and a back side opposite the front side, the wafer including a plurality of metal-oxide-semiconductor field-effect transistors (MOSFETs), each MOSFET of the plurality of MOSFETs comprising
a source electrode, a gate electrode, and a drain electrode positioned at the front side of the wafer; and
a plurality of partial drain plugs extending a first depth from the front side into the wafer, the plurality of partial drain plugs connected to the drain electrode;
forming a redistribution layer on the front side of the wafer;
grinding the back side of the wafer forming a thinned wafer;
depositing a metal layer on a back side of the thinned wafer; and
applying a singulation process so as forming the plurality of semiconductor packages;
wherein after the step of grinding the back side of the wafer, the method further comprises applying a conductive adhesive layer to a back side of the metal layer; and bonding a metal supporting structure to the conductive adhesive layer.

17. A method for fabricating a plurality of semiconductor packages, the method comprising the steps of:
providing a wafer comprising a front side and a back side opposite the front side, the wafer including a plurality of metal-oxide-semiconductor field-effect transistors (MOSFETs), each MOSFET of the plurality of MOSFETs comprising
a source electrode, a gate electrode, and a drain electrode positioned at the front side of the wafer; and
a plurality of partial drain plugs extending a first depth from the front side into the wafer, the plurality of partial drain plugs connected to the drain electrode;
forming a redistribution layer on the front side of the wafer;
grinding the back side of the wafer forming a thinned wafer;
depositing a metal layer on a back side of the thinned wafer; and
applying a singulation process so as forming the plurality of semiconductor packages;
wherein after the step of forming the redistribution layer, the method further comprises forming a first molding encapsulation enclosing sidewalls of the redistribution layer.

* * * * *